(12) United States Patent
Koga et al.

(10) Patent No.: US 7,042,735 B2
(45) Date of Patent: May 9, 2006

(54) FITTING SUBSTRATE FOR CONNECTION AND FITTING SUBSTRATE FOR CONNECTION FOR USE IN DISK ARRAY CONTROL APPARATUS

(75) Inventors: Tsutomu Koga, Matsuda (JP); Mitsuru Inoue, Hiratsuka (JP); Nobuyuki Minowa, Ooi (JP)

(73) Assignee: Hitachi, Ltd., Tokyo (JP)

( * ) Notice: Subject to any disclaimer, the term of this patent is extended or adjusted under 35 U.S.C. 154(b) by 114 days.

(21) Appl. No.: 10/766,848

(22) Filed: Jan. 30, 2004

(65) Prior Publication Data

US 2005/0083666 A1    Apr. 21, 2005

(30) Foreign Application Priority Data

Oct. 16, 2003  (JP) .............................. 2003-355902

(51) Int. Cl.
*H01R 12/16* (2006.01)
(52) U.S. Cl. .................. 361/788; 361/796; 710/100
(58) Field of Classification Search ................ 361/788; 710/100, 305; 360/93.3
See application file for complete search history.

(56) References Cited

U.S. PATENT DOCUMENTS

| | | | |
|---|---|---|---|
| 4,866,508 A | | 9/1989 | Eichelberger et al. |
| 4,868,634 A | | 9/1989 | Ishida et al. |
| 4,942,453 A | | 7/1990 | Ishida et al. |
| 4,955,020 A | * | 9/1990 | Stone et al. ............... 370/360 |
| 4,994,902 A | | 2/1991 | Okahashi et al. |
| 5,122,691 A | * | 6/1992 | Balakrishnan ............... 326/86 |
| 5,388,099 A | | 2/1995 | Poole |
| 5,420,756 A | | 5/1995 | Katsumata et al. |
| 5,544,330 A | * | 8/1996 | Bither et al. ................ 710/100 |
| 5,583,867 A | * | 12/1996 | Poole ......................... 370/257 |
| 6,105,088 A | * | 8/2000 | Pascale et al. ............. 710/100 |
| 6,392,142 B1 | | 5/2002 | Uzuka et al. |
| 6,917,998 B1 | * | 7/2005 | Giles ......................... 710/300 |
| 2002/0074670 A1 | | 6/2002 | Suga |
| 2004/0090758 A1 | | 5/2004 | Horikawa |

FOREIGN PATENT DOCUMENTS

JP        11-312854        11/1999

\* cited by examiner

*Primary Examiner*—Kamand Cuneo
*Assistant Examiner*—Tuan Dinh
(74) *Attorney, Agent, or Firm*—Mattingly, Stanger, Malur & Brundidge, P.C.

(57) ABSTRACT

The invention efficiently mounts substrates to back planes and accomplishes high quality signal transfer. Connectors to which N adaptor substrates are fitted and connectors to which M bus switch substrates are fitted are provided to a multi-layered back plane. Signal pin groups of the connector on the adaptor substrate side are grouped into M data paths. Signal pins of the connector on the adaptor substrate side and corresponding signal pins of the connector on the bus switch substrate side are arranged horizontally in such a fashion as to exist on the same plane (with positions in a Z direction being substantially equal). Therefore, wiring patterns for connecting corresponding signal pins can be formed substantially linearly and a large number of substrates can be efficiently mounted to a limited area.

2 Claims, 13 Drawing Sheets

FITTING SUBSTRATE FOR CONNECTION AND FITTING SUBSTRATE FOR CONNECTION FOR USE IN DISK ARRAY CONTROL APPARATUS

CROSS-REFERENCES TO RELATED APPLICATIONS

This application relates to and claims priority from Japanese Patent Application No. 2003-355902, filed on Oct. 16, 2003, the entire disclosure of which is incorporated herein by reference.

BACKGROUND OF THE INVENTION

1. Field of the Invention

This invention relates to a fitting substrate for connection to which a plurality of signal processing substrates is fitted. For instance, the invention relates to a fitting substrate for connection that will be suitable for use in a disk array control apparatus, or the like.

2. Description of the Related Art

In an electronic appliance such as a disk control apparatus, for example, a plurality of signal processing substrates is fitted to accomplish respective functions. Known examples of such signal processing substrates include a memory substrate having cache memories and shared memories mounted thereto, a bus switch substrate for controlling access to the memory substrate and an adaptor substrate for gaining access to the memory substrate through the bus switch substrate and reading and writing data. The adaptor substrate is used for transmitting and receiving data to and from a host computer and a disk apparatus. These signal processing substrates are respectively fitted to a fitting substrate for connection that is referred to as a "back plane". Each signal processing substrate is electrically connected through printed wires formed on the back plane. According to a known technology, for example, a plurality of printed substrates is fitted to each surface of a back panel and both printed substrates are connected to each other through printed wires formed on the back panel (JP-A-11-312854).

The bus switch substrate on the data reception side is connected to a plurality of adaptor substrates (a plurality of host adaptor substrates and a plurality of disk adaptor substrates). Therefore, signal pins of the connector to which the bus switch substrate is fitted are divided into groups each corresponding to each adaptor substrate. On the other hand, each adaptor substrate on the data transmission side has a common interface. Therefore, the arrangement of the signal pins of the connector to which each adaptor substrate is fitted is in common.

As described above, the positions of the signal pins are different between the data reception side (bus switch substrate) and the data transmission side (adaptor substrate) that are to be mutually connected. Therefore, printed wiring for mutually connecting the corresponding signal pins is formed in such a fashion that a wiring direction can be changed appropriately inside the back plane. According to the known technology, therefore, the printed wiring is formed in the bent form in many cases and curve points develop in the printed wiring. Radiation noise is likely to occur at the curve point. Because impedance changes with the change of the line width at the curve point, reflection of signals is likely to occur, too. When the curve point exists in the printed wiring, signal quality is likely to drop. Particularly because a disk array control apparatus controls high-speed data communication made between a disk apparatus and a host computer, influences of the curve points of the printing wiring on the drop of quality of high-speed data communication are great.

The reason why the curve point occurs in the printed wiring will be explained with reference to FIGS. 10 to 13.

FIG. 10 is an enlarged schematic perspective view of a part of the disk array control apparatus. A large number of connectors 501 are disposed on the front surface side of a back plane 500 constituted as a multi-layered printed substrate. The back plane 500 is put perpendicularly (in a Z direction) inside a control box (not shown). A plurality of rows of connectors 501 extending in the Z direction is arranged in an X direction with gaps among them. A plurality of various kinds of substrates 510 and 520 is fitted to the back plane 500, respectively.

One kind 510 of the substrates is an adaptor substrate for transmitting and receiving data to and from a host computer or a disk apparatus, for example. The adaptor substrate connected to the host computer is also referred to as a "host adaptor substrate" or a "channel adaptor substrate". The adaptor substrate connected to the disk apparatus is called a "disk adaptor substrate". The host adaptor substrate and the disk adaptor substrate have the same interface structure and their signal pin arrangement is the same, too. Therefore, both of them will be generically called hereinafter the "adaptor substrate 510".

The other substrate 520 is a bus switch substrate (that may be called also "switch control substrate") for controlling connection with a cache memory substrate or a shared memory substrate (both of which are not shown in the drawing). The bus switch substrate for controlling connection with the cache memory substrate switch substrate is called a "cache memory bus switch substrate" and the bus switch substrate for controlling connection with the shared memory substrate is called a "shared memory bus switch substrate". Therefore, they are altogether called hereby the "bus switch substrate 520".

Each adaptor substrate 510 is connected to each bus switch substrate 520. Therefore, the signals outputted from a signal processing LSI 511 of each adaptor substrate 510 are gathered for each bus switch substrate 520 as the connection destination as represented by path groups PG11 to PG14. Similarly, each bus switch substrate 520, too, is connected to each adaptor substrate 510. Therefore, the signals outputted from a signal processing LSI 521 of each bus switch substrate 520 are gathered for each adaptor substrate 510 as the connection destination as represented by path groups PG21 to PG24.

The output positions of the signals from each of the LSI 511 and 521 extend in the arranging direction (Z direction) of the respective connectors 512 and 522 so as to easily accomplish equidistant wiring inside each of the adaptor substrate 510 and the bus switch substrate 520. The arrangement of the signal pins of the connector 512 of each adaptor substrate 510 is the same. Here, the connector 512 of each adaptor substrate 510 and the connector 522 of each bus switch substrate 520 serially correspond to one another from the upper side. Therefore, when the signal pins of a plurality of adaptor substrates 510 and the corresponding signal pins of the bus switch substrates 520 adjacent to the former in the X direction are connected, adjustment in the Z direction becomes necessary. This adjustment in the Z direction generates the curve points in the printed wiring.

As shown in FIG. 11, the data path group taken out at the uppermost part of the first adaptor substrate 510-1 in the Z direction is connected to the uppermost signal connector 522 of the bus switch substrate 520 from the uppermost connector of the signal connector 512-1 in the Z direction through the printed wiring of the back plane 500. Next, let's consider the first adaptor substrate 510-1 and the second adaptor substrate 510-2 adjacent to the former in the X direction. Then, the data path taken out at the uppermost part of the second adaptor substrate 510-2 in the Z direction is connected to the connector just below the uppermost signal connector of the bus switch substrate 520 in the Z direction. Because each of the adaptor substrates 510-1 and 510-2 has the same signal arrangement, the printed wiring must be adjusted in the Z direction on the back plane 500 in order to connect them to the same bus switch substrate 520.

FIG. 12 shows in partial enlargement the mode of connecting N adaptor substrates 510 and M bus switch substrates 520 (only one of which is shown in the drawing) through the printed wiring of the back plane 500. FIG. 12 shows the connectors of each substrate. Connectors 512-11 to 512-NM are fitted to the N adaptor substrates 510. The first bus switch substrate 520 is shown fitted to the connectors 522-11 to 522-1N on the right side in the drawing. Here, the suffix allocated to the reference numeral of each connector will be explained. The numeral of the first digit after the hyphen represents the substrate number and the numeral of the second digit represents the data path group number. Therefore, the connector 512-11 represents the connector corresponding to the first data path group of the first adaptor substrate 510. Similarly, the connector 512-NM represents the connector corresponding to the Mth data path group of the Nth adaptor substrate 510. This also holds true of the connector 522 of the bus switch substrate 520. Only one row of the connectors for the bus switch substrate is shown for the sake of explanation and reference numeral 522-MN is allocated to the connector corresponding to the Nth data path group of the Mth bus switch substrate 520.

N adaptor substrates 510 are connected to M bus switch substrates 520, respectively. Therefore, in the case of the connectors 512-11 to 512-1M for the first adaptor substrate, the first connector 512-11 is connected to the connector 522-11 for the first bus switch substrate. The second connector 512-12 is connected to the second bus switch substrate 522-21 (not shown). Similarly, the connectors 511-1 to 511-1N for the first adaptor substrate are connected to the connectors 522-11 to 522-M1 (not shown other than 522-11) for all the bus switch substrates, respectively. Let's consider the connectors 512-21 to 512-2M for the second adaptor substrate. The first connector 512-21 is connected to the connector 522-12 for the first bus switch substrate and the connector 512-22 for the second adaptor substrate is connected to the connector 522-22 (not shown) for the second bus switch substrate. Similarly, the connectors 522-21 to 522-2M for the second adaptor substrate are connected to the connectors 522-22 to 522-M2 for all the bus switch substrates, respectively. This also holds true of the connectors (512-31 to 512-3M) to (512-N1 to 512-NM) (only apart of which is shown) for the third to Nth adaptor substrates.

A concrete wiring method will be explained. The arrangement of the signal pins of the connectors for the adaptor substrates are set to the (X, Y) coordinates and the pin number, to (Xa, Za). The first connector 512-11 positioned at the uppermost position of the connector for the first adaptor substrate has the signal pins at the coordinates (1, 1) to the coordinates (X1a, Z1a). On the other hand, the signal pins of the connector for the bus switch substrate start from the coordinates (1, 1) and end up with the coordinates (Xb, Zb).

The case where the signal pins of the data path group of the connector 512-11 for the adaptor substrate are connected to the signal pins of the connector 522-11 for the bus switch substrate will be first explained in detail. To begin with, the signal pin positioned at the coordinates (1, 1) of the connector 512-11 for the adaptor substrate is connected to the signal pin positioned at the coordinates (1, 1) of the connector 522-11 for the bus switch substrate. In this case, the wire is taken out at an angle of 45 degrees in a Z1-X1 direction (right downward direction in the drawing) lest the printed wiring pattern come into contact with each through-hole clearance of the second signal pin (2, 1) et seq to (Xa, 1) in the X axis direction. The wire is then extended in the X1 direction to a position in the proximity of the signal pin positioned at the coordinates (1, 1) of the connector 522-11 for the bus switch substrate at the position where the printing wiring pattern does not contact with the each through-hole clearance provided above and below the Z-direction. The end of the wire is bent at 450 in an X1-Z2 direction (right upward direction in the drawing) and is connected to the signal pin (1, 1) of the connector 522-11 for the bus switch substrate. In other words, the printed wire is extended in the horizontal direction (X direction) by selecting a position not interfering with each through-hole clearance, and is bent at 45° and connected to the signal pins on the sides of both start and terminal ends. Thereafter, each signal pin of the connector 512-11 for the adaptor substrate is connected in the same way to each corresponding signal pin of the connector 522-11 for the bus switch substrate.

Here, because the gap between the signal pins and the wiring width are limited, only a predetermined number T of wiring patterns can be passed through each through-hole clearance. The explanation will be given hereby about the case of T=2. In the case of the signal pin positioned at an odd-numbered (2n+1)th position in the Z direction, the wiring is taken out from below (on the Z2 side) of this signal pin. As to the signal pin positioned at an even-numbered (2n)th position in the Z direction, the wire is taken out from above (on the Z1 side) of this signal pin. The first to Zlath, in the Z direction, (represented as Za in the drawing) signal pins constituting the row of (X coordinates=1) area 11 wired by the method described above. Next, the signal pins constituting the X coordinates=2 are similarly connected to the corresponding signal pins of the connector 522-11 for the bus switch substrate. Here, because the wire for connecting each signal pin of the row of the X coordinates=1 has already been passed through the gap of the signal pins constituting the row of the X coordinates=2, connection must be so made as to avoid this wire. In the row of the X coordinates=2, therefore, the signal pin positioned at an odd-numbered (2n+1)th position in the Z direction is so wired as to pass above this signal pin and the signal pin positioned at an even-numbered (2n)th position in the Z direction is so wired as to pass below this signal pin, on the contrary to the row of the X coordinates=1.

Next, wiring is made for each signal pin constituting the row of the X coordinates=3. However, because the wires for connecting the signal pins constituting the rows of the X coordinates=1 and the X coordinates=2 have already been arranged, wiring cannot be made on the same plane. Therefore, as to the signal pins constituting the rows of the X coordinates=3 and the X coordinates=4, another layer different from the wiring layer used for wiring the signal pins constituting the rows of the X coordinates=1 and the X coordinates=2 is used. Thereafter, whenever the value of the X coordinates assumes an odd number (X=2n+1), the wiring layer is changed. In this way, the printed wiring pattern is set so that all the signal pins of the connector 512-11 for the adaptor substrate can be connected to the corresponding signal pins of the connector 522-11 for the bus switch substrate.

The wiring pattern for connecting the signal pins of the connector for each adaptor substrate to the signal pins of the connector for the bus switch substrate is thereafter set similarly. Because the Z direction coordinates of the corresponding connectors are different as also shown in enlargement in FIG. 7, most of the wires taken out from the connectors for the adaptor substrates are taken out in the X direction, are then bent in the Z direction, again extend in the X direction and are connected to the connectors for the bus switch substrates. In other words, a Z direction adjustment region 600 must be secured in advance so that each printed wiring can extend in the Z direction. Consequently, a plurality of curve points occurs in each printed wiring and results in deterioration of signal quality. Because a predetermined clearance must also be secured between the wires, the width of the Z direction adjustment region 600 becomes greater with the increase of the number of wires. The greater the number of the substrates to be fitted to the back plane 500 is, the greater becomes the area of the back plane 500 and the size of the casing of the apparatus. Nonetheless, the market strongly needs a smaller disk array system having higher performance due to the limited size of the mounting space. To achieve higher performance, the number of substrates connected to the back plane 500 must be increased but the increase of the number of substrates invites the increase of the size of the casing of the apparatus. The prior art technology thus has a tradeoff relation between the reduction of the size of the apparatus and higher performance.

SUMMARY OF THE INVENTION

In view of the problems described above, it is an object of the invention to provide a fitting substrate for connection and a fitting substrate for connection for use in a disk array control apparatus, the fitting substrate for connection capable of achieving high density mounting of signal processing substrates.

It is another object of the invention to provide a fitting substrate for connection and a fitting substrate for connection for use in a disk array control apparatus, the fitting substrate for connection capable of increasing the fitting number of signal processing substrates without inviting the increase of a size of the apparatus.

The above and other objects and novel features of the invention will become more apparent from the following description of embodiments thereof.

DESCRIPTION OF THE PREFERRED EMBODIMENTS

Figure 1:
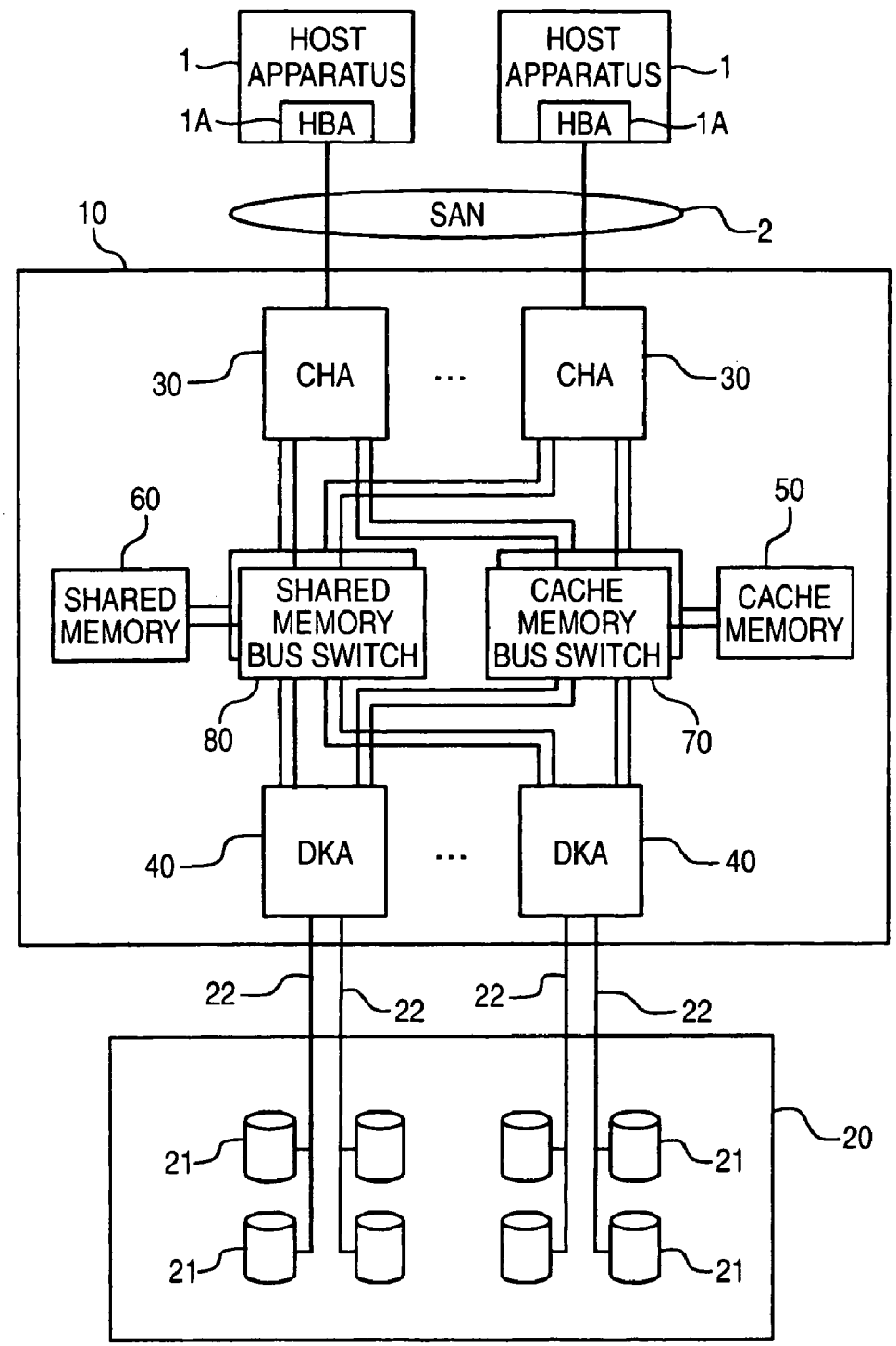
FIG. 1 is a block diagram showing as a whole a disk array subsystem according to an embodiment of the invention.

To accomplish the object described above, the invention provides a fitting substrate for connection to which first and second kinds of signal processing substrates mutually transmitting and receiving signals are fitted, the substrate comprising a substrate main body; a first signal connection point group formed on the substrate main body and connected to the first kind of signal processing substrate; a second signal connection point group formed on the substrate main body and connected to the second kind of signal processing substrate; and a wiring pattern group for electrically connecting mutually corresponding signal connection points of the first and second signal connection points group to one another; wherein the first and second signal connection point groups are respectively formed so that mutually corresponding signal connection points can be arranged substantially horizontally on the same plane, and the wiring pattern group is formed substantially linearly in match with the arrangement of each of said signal connection points.

The first kind of signal processing substrate (hereinafter called "first signal processing substrate") and the second kind of signal processing substrate (hereinafter called "second signal processing substrate") are respectively fitted to at least one fitting substrate for connection. The number of the first signal processing substrate may be the same as, or different from, the number of the second signal processing substrate. A first signal connection point group to which the first signal processing substrate is connected and a second signal connection point group to which the second signal processing substrate is connected are respectively formed at predetermined positions of the substrate main body of the fitting substrate for connection. Each of these connection point groups is constituted as signal pins of an electric connector, for example. The first and second signal connection point groups are formed in such a fashion that their corresponding signal connection points are arranged substantially horizontally on the same plane. Therefore, wiring pattern groups for connecting the first signal connection point group to the second signal connection point group can be formed substantially linearly. Here, the formation of the wiring pattern group into a substantially linear form means that the wiring pattern group is formed substantially linearly and represents, for example, that the major proportion of the wiring length of the wiring pattern group other than both end portions is formed into a line.

In the first mode for carrying out the invention, the first and second signal connection point groups are so formed on the same plane as to extend in a first direction and the wiring pattern group is so formed as to extend in a second direction intersecting orthogonally the first direction.

The first and second signal connection point group maybe formed a plurality of signal connection points, respectively. The signal connection point groups may be formed by aligning a plurality of signal connection points in a first direction. Alternatively, the signal connection point groups may be formed of a plurality of rows formed by aligning a plurality of signal connection points in the first direction. When one signal connection point group is constituted by a plurality of signal connection point rows, the positions of the rows maybe somewhat deviated in the first direction.

In a mode for carrying out the invention, N1 of the first kind of signal processing substrates and N2 of the second kind of signal processing substrates are fitted to the substrate main body, the first signal connection point group is constituted by N2 of signal path groups adjacent to one another in the second direction and the second signal connection point group is constituted by N1 of signal path groups adjacent to one another in the second direction.

Because each signal connection point group is constituted by the signal path groups adjacent to one another in the second direction, the wiring pattern groups can be formed substantially linearly in the second direction.

In the mode or carrying out the invention, the substrate main body is formed into multiple layers and the wiring pattern group is formed by use of a plurality of wiring layers of the substrate main body.

In other words, the fitting substrate for connection is constituted by stacking dozens of wiring layers, for example, and each wiring pattern constituting the wiring pattern group can be formed in each wiring layer.

In the mode for carrying out the invention, the first signal connection point group is constituted by a plurality of first signal connection rows adjacent to one another in the second direction, the second signal connection point group is constituted by a plurality of second signal connection rows adjacent to one another in the second direction, and each of the connection groups constituted by at least one of the first signal connection row and at least one of the second signal connection rows is connected by the wiring pattern group by using different ones of the wiring layers.

Each wiring pattern group is constituted by a wiring pattern for each connection group, and the wiring pattern for each connection group is formed in each wiring layer. In other words, a certain wiring layer is used for wiring of a certain connection group and other wiring layer is used for wiring of other connection group. Incidentally, a plurality of connection groups can be wired in each wiring layer. Further, the wiring pattern does not need to be formed in all the wiring layers in the substrate main body. One or more non-wired wiring layer may be included, too.

In the embodiment of the invention, N2 signal path groups of each of the signal processing substrates are connected by the wiring pattern group by using different ones of the wiring layers.

In this case, the signal path group coincides with the connection group. Wiring patterns corresponding to mutually different signal path groups are formed for each wiring layer.

In the mode for carrying out the invention, the wiring pattern group is formed to a length of 100% to 120% with respect to a distance between the mutually corresponding signal connection points.

In other words, when the distance between the mutually corresponding signal connection points is L, the wiring length PL of the wiring pattern for connecting each signal point is 1 to 1.2 times the length of L ($L \leq PL \leq 1.2L$). When the wiring pattern can be formed linearly, the wiring length PL and the distance L are substantially equal to each other. However, when a plurality of rows of signal connection points exist and are aligned in the second direction, however, the end portion of the wiring pattern must somewhat be separated to avoid interference. In this case, the wiring length PL becomes greater than the distance L but doe not exceed 1.2 times the distance L.

In the mode for carrying out the invention, the wiring pattern group is formed linearly with the exception of portion in the proximity of the mutually corresponding connection points.

To avoid the interference in the through-hole clearance, the end portion of each wiring pattern is formed by an oblique line, or the like, other than the straight line in the proximity of the signal connection point.

According to another aspect of the invention, there is provided a fitting substrate for connection for use in a disk array control apparatus to which a memory substrate, a bus switch substrate for controlling connection with the memory substrate and an adaptor substrate for gaining access to the memory substrate through the bus switch substrate are fitted, comprising a substrate main body; a bus switch signal connection point group formed on the substrate main body and connected to the bus switch substrate; an adaptor signal connection point group formed on the substrate main body and connected to the adaptor substrate; and a wiring pattern group for electrically connecting mutually corresponding signal connection points of the bus switch signal connection point group and the adaptor signal connection point group; the bus switch signal connection point group and the adaptor signal connection point group being formed in such a fashion that the mutually corresponding signal connection points are arranged substantially horizontally on the same plane; the wiring pattern group being formed substantially linearly in match with the arrangement of each of the signal connection points.

The disk array control apparatus controls the operation of the disk array subsystem. The disk array subsystem manages a plurality (generally, a large number) of disk apparatuses to provide individual storage areas for a plurality of host computers. Therefore, the disk array control apparatus includes an interface substrate (host adaptor substrate) for exchanging data with a plurality of host computers, an interface substrate (disk adaptor substrate) for exchanging data with a plurality of disk apparatus, a memory substrate for temporarily storing the data and a bus switch substrate for controlling the connection between the memory substrate and each adaptor substrate. The various kinds of substrates are fitted to predetermined positions of the fitting substrate for connection on which the predetermined wiring pattern groups are formed and are electrically connected. The fitting substrate for connection to which the various kinds of substrates are fitted is accommodated in a casing having a predetermined size. In this way, a plurality of kinds of substrates is fitted to the fitting substrate for connection in the disk array control apparatus and the size of the casing is limited. When the corresponding signal connection points are arranged substantially horizontally on the same plane and the wiring pattern groups are formed substantially linearly, a large number of substrates can be efficiently accommodated inside a limited space and can be electrically connected.

According to still another aspect of the invention, there is provided a disk array control apparatus comprising a fitting substrate for connection; a memory substrate fitted to one of the surfaces of the fitting substrate for connection; a bus switch substrate fitted to the one surface, for controlling connection with the memory substrate; and an adaptor substrate fitted to the one surface, for gaining access to the memory substrate through the bus switch substrate; the fitting substrate for connection including a bus switch signal connection point group connected to the bus switch substrate; an adaptor signal connection point group connected to the adaptor substrate; and a wiring pattern group for electrically connecting mutually corresponding signal connection points of the bus switch signal connection point group and the adaptor signal connection point group; the bus switch signal connection point group and the adaptor signal connection point group being formed in such a fashion that the mutually corresponding signal connection points are arranged substantially horizontally on the same plane; the wiring pattern group being formed substantially linearly in match with the arrangement of each of the signal connection points.

First Embodiment

Referring to FIGS. 1 to 9, a first embodiment of the invention will be hereinafter explained about an example where the invention is applied to a disk control portion of a disk array subsystem. An overall construction of the disk array subsystem will be first explained, followed then by the explanation of a fitting state of various substrates.

FIG. 1 is a schematic block diagram showing a functional construction of the disk array subsystem. The disk array subsystem is broadly divided into a disk array control portion 10 and a disk apparatus 20. The disk array subsystem writes and reads data to and from the disk apparatus 20 in accordance with a request from a host apparatus 1 and transfers the data to the host apparatus 1.

Each host apparatus 1 is a CPU (Central Processing Unit) or a computer system equipped with memories, for example. Each host apparatus 1 uses a personal computer, a work station, a main frame or a mobile information terminal, for example. The host apparatus 1 is connected to an SAN (Storage Area Network) 2 through an HBA (Host Bus Adaptor) 1A. The host apparatus 1 is further connected to the disk array subsystem through the SAN 2 and transmits and receives the data. Though two host apparatuses 1 are shown in the drawing, a large number of host apparatuses 1 can utilize the disk array subsystem in practice. Connection between the host apparatus 1 and the disk array subsystem is not limited to the SAN but other networks such as an LAN (Local Area Network) or a dedicated line can be utilized, too.

The disk array control portion 10 controls the operation of the disk array subsystem. The disk array control portion 10 includes a plurality of channel adaptors 20, a plurality of disk adaptors 40, a cache memory 50, a shared memory 60, a cache memory bus switch 70, a shared memory bus switch 80 and a management terminal not shown in the drawing.

Each channel adaptor 30 exchanges data with the host apparatus 1 and is referred to as a "host adaptor", too. The channel adaptor 30 has a communication interface for making communication with the host apparatus 1 connected thereto and a command processor function for interpreting and executing various commands it receives from the host apparatus 1. The channel adaptor 30 can individually accept the data input/output request from each host apparatus 1. Incidentally, each host apparatus 1 can gain access to only a logic unit having access authorization due to zoning technologies, and the like.

Each disk adaptor 40 exchanges the data with the disk apparatus 20. When the host apparatus 1 generates the data write request through the channel adaptor 20, for example, the disk adaptor 40 writes the data to a predetermined address of a memory area on the basis of this write command. The data to be written is stored in the cache memory 50 and the write command is stored in the shared memory 60. The disk adaptor 40 gains access to the shared memory 60 through the shared memory bus switch 80 and can understand that the write command is generated. The disk adaptor 40 gains access to the cache memory 50 through the cache memory bus switch 70 and reads out the data to be written from the cache memory 50. The disk adaptor 40 lets the disk apparatus 20 store the data read out from the cache memory 50. In this instance, the disk adaptor 40 converts the logic address designated by the host apparatus 1 to a physical address and thus converts the data write request for the logic volume to the data write request for the physical disk. When the host apparatus 1 generates the data read request, the disk adaptor 40 executes address conversion, reads out the designated data from the disk apparatus 20 and lets the cache memory 50 stores the data so readout. The data stored in the cache memory 50 is transferred from the cache memory bus switch 70 to the host apparatus 1 through the channel adaptor 30.

The cache memory 50 and the shared memory 60 are those internal memories that are shared by each channel adaptor 30 and each disk adaptor 40. The cache memory 50 mainly stores the data received from the host apparatus 1 and the data read out from the disk apparatus 20. The shared memory 60 mainly stores control information and the commands. The shared memory 60 is used also as a work area, and the like. The cache memory 50 is connected to each channel adaptor 30 and to each disk adaptor 40 through the cache memory bus switch (hereinafter abbreviated as "CSW") 70. The shared memory 60 is connected to each channel adaptor 30 and to each disk adaptor 40 through the shared memory bus switch (hereinafter abbreviated as "SSW") 80. Each of the bus switches 70 and 80 can be constituted by a cross-bus switch, for example.

The disk apparatus 20 is constituted by arranging a large number of disk storage devices 21 in an array and provides a memory area managed by RAID (Redundant Array of Independent Disks), for example, to the host apparatus 1. Various disks such as a hard disk device, a flexible disk device, an optical disk device, a semiconductor memory device, and so forth, can be used as the disk storage device. A logical memory area (logical volume) is formed on the physical memory area of each disk storage device 21 and at least one logical volume is provided to each host apparatus 1.

Incidentally, because each of the functional elements 30 to 80 described above is provided as a discrete signal processing substrate, the substrate of each disk adaptor 40 will be referred to as a "DKA substrate" 40, the substrate of each channel adaptor 30, as a "CHA substrate" 30, the substrate of each cache memory 50, as a "CM substrate" 50, the substrate of the shared memory 60, as an "SM substrate" 60, the substrate of the CSW 70, as a "CSW substrate" 70 and the substrate of he SSW 80 as an "SSW substrate" 80 in the following explanation.

As described above, the disk array subsystem employs the redundant structure to insure reliable data input/output. In other words, the RAID manages the recording area of the disk apparatus 20 and moreover, a plurality of various kinds of substrates 30 to 80 is generally disposed. Consequently, even when any trouble occurs in any one of the data paths, the data can be inputted and outputted through other data paths. The disk array control portion 10 has its feature in that unlike ordinary household appliances, it must be equipped with a plurality of substrates of different kinds.

Figure 2:
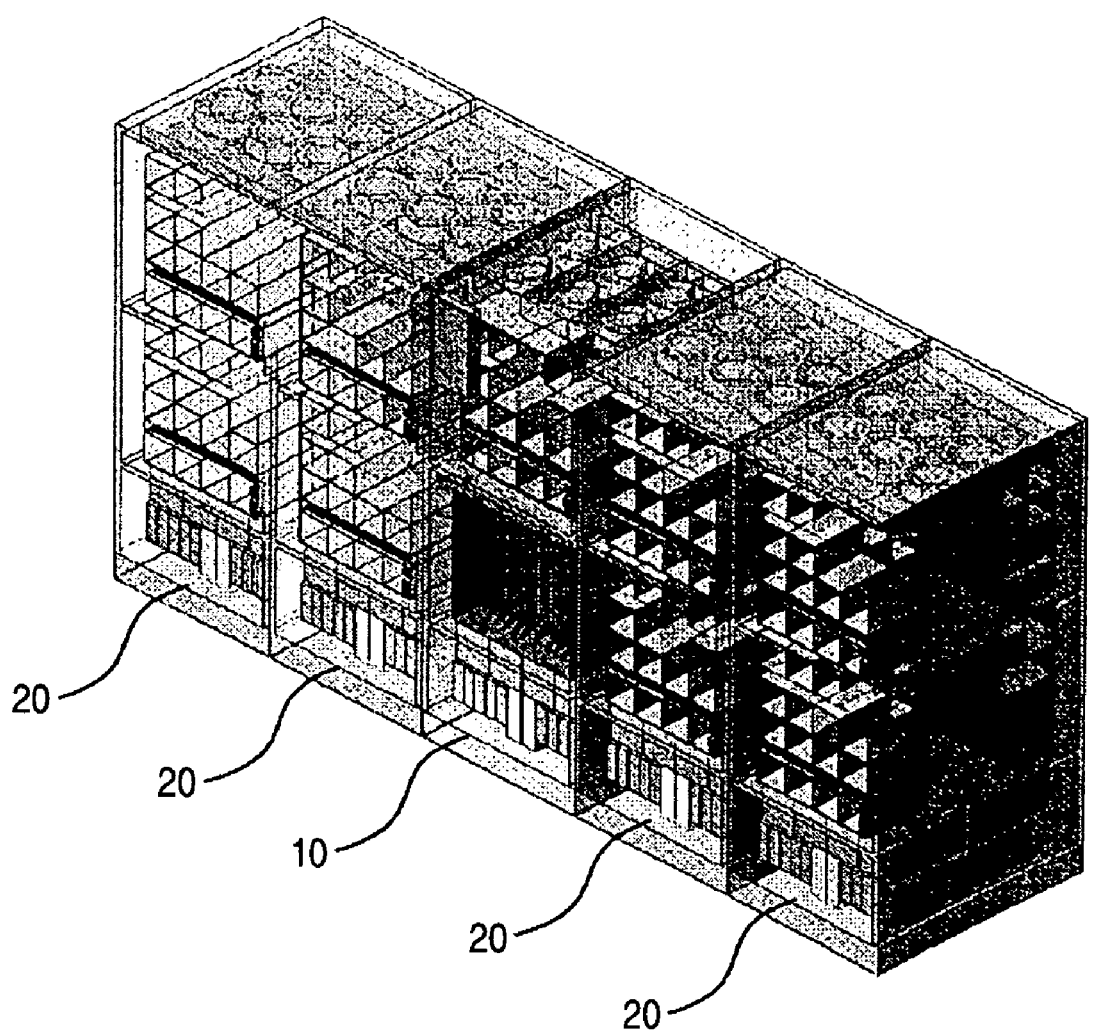
FIG. 2 is a perspective view showing appearance of the disk array subsystem.

Next, FIG. 2 shows an appearance construction of the disk array subsystem. The disk array subsystem includes the disk array control portion 10 arranged at the center in the drawing and a plurality of disk apparatuses 20 arranged on both sides of the disk array control portion 10. The disk array control portion 10 and each disk adaptor 40 of the disk apparatus 20 are connected through a fiber cable, for example, and can transmit and receive the data by block transfer based on a fiber channel protocol.

Figure 3:
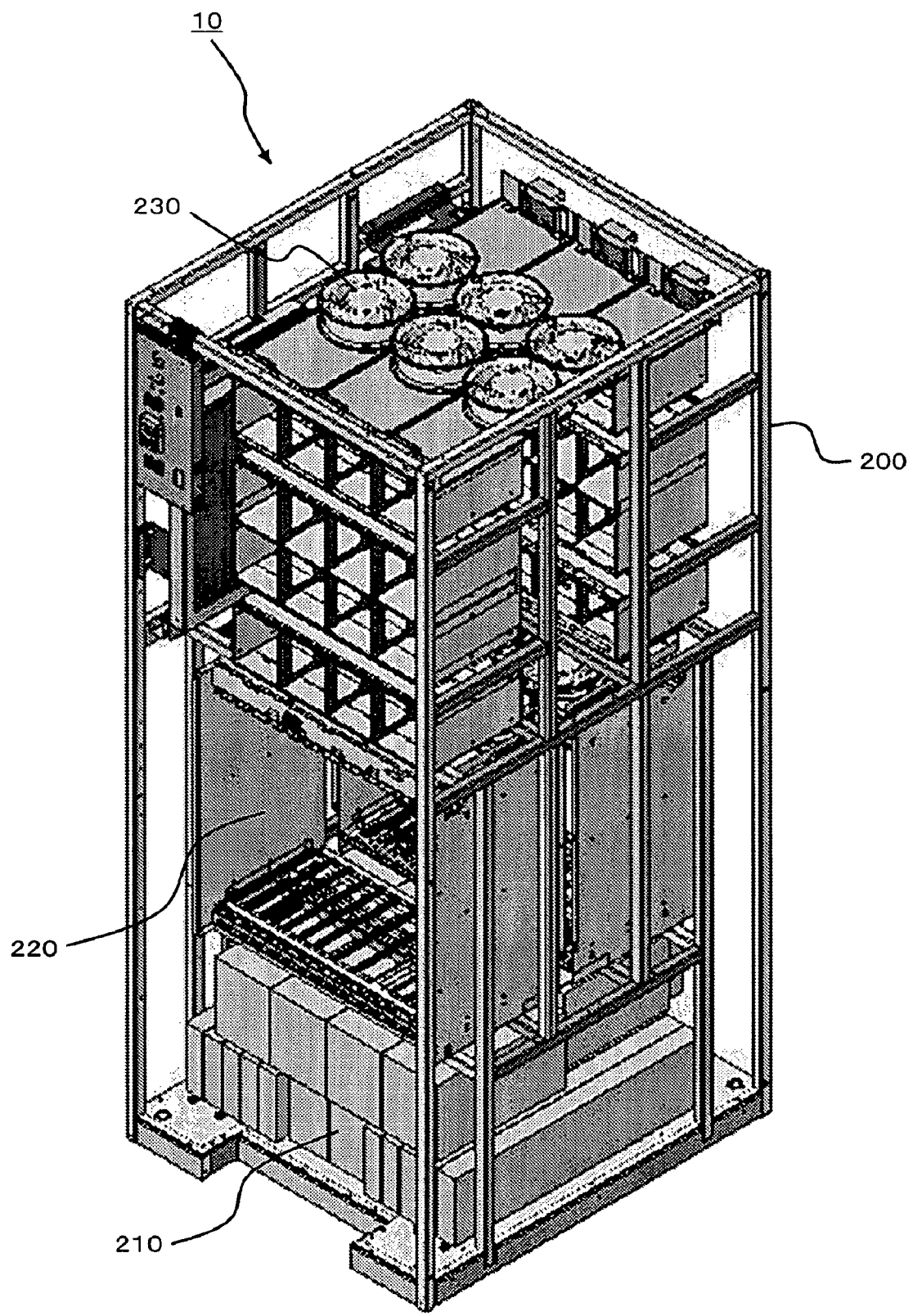
FIG. 3 is a perspective view showing appearance of a disk array control portion.

FIG. 3 shows an appearance construction of the disk array control portion 10. The disk array control portion 10 includes a case frame 200, a power source unit 210 arranged at a lower part of the case frame 200, a control box 220 arranged on the upper side of the power source unit 210 and a cooling fan unit 230 disposed above the case frame 200 and can make a non-stop operation. The control box 220 is a casing for accommodating the CHA substrate 30, the DKA substrate 40, the CM substrate 50, the SM substrate 60, the CSW substrate 70 and the SSW substrate 80. To accommodate a large number of substrates, the control box 220 has a construction such that a plurality of substrates can be accommodated in parallel from both front and back of the control box 220.

Figure 4:
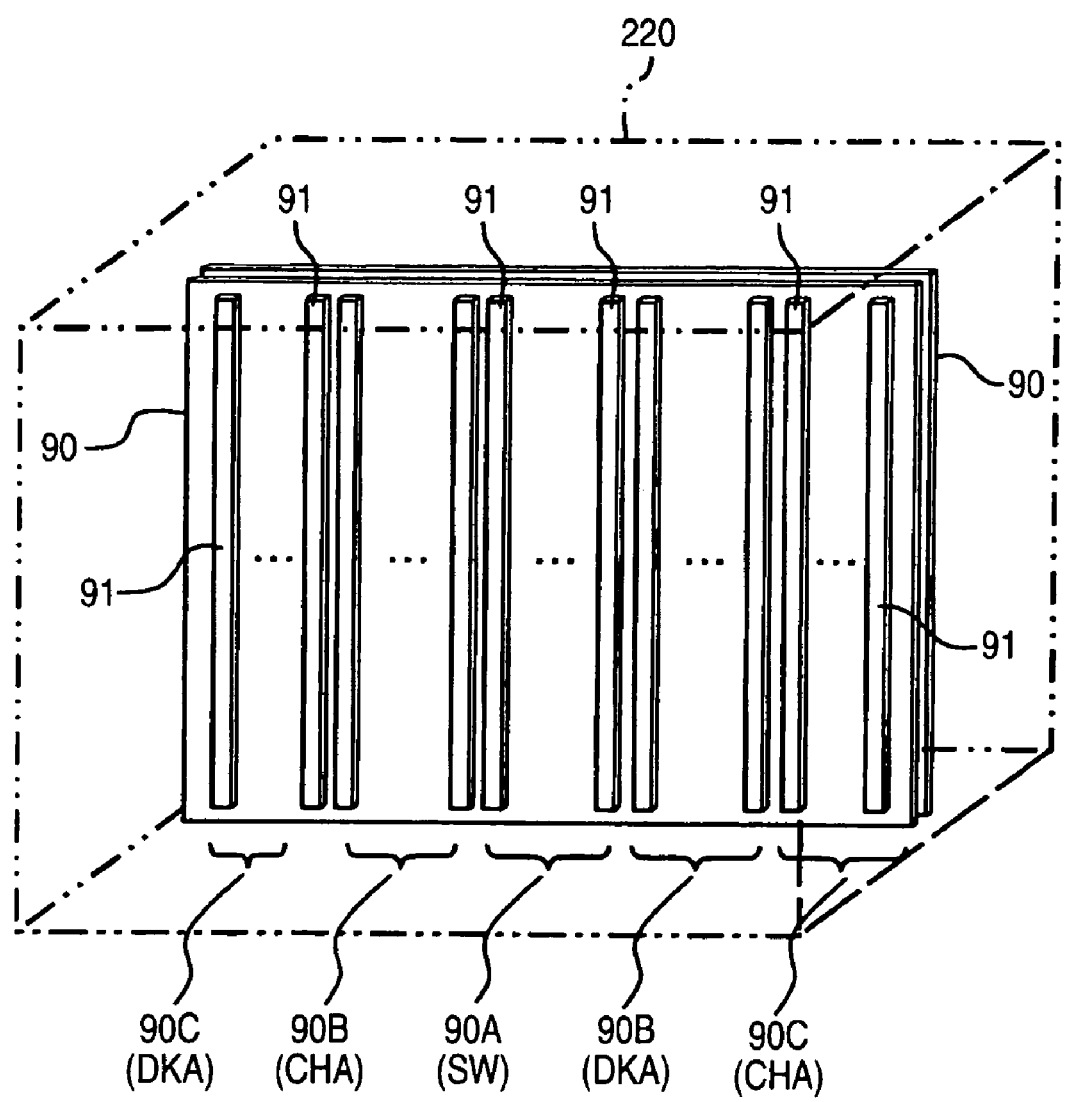
FIG. 4 is an explanatory view showing a schematic structure of a control box of the disk array control portion.

FIG. 4 shows a schematic construction inside the control box 220. Two back planes 90 are fitted back to back to the center portion of the control box 220 in such a fashion as to divide the control box 220 into two spaces. Each back plane 90 is constituted into a multi-layered structure such as a 24-layered or 28-layered structure. The front and back surfaces of the control box 220 are open as described above. Therefore, various substrates can be vertically fitted to the back plane 90 on the front side from the front opening and to the back plane 90 on the back side from the back opening, respectively. Connectors 91 are arranged on the surface of the back plane 90 to fit the various substrates. Mounting areas 90A to 90C are set in advance on the back plane 90 so as to fit the various substrates. Only predetermined kinds of substrates can be fitted to each of these mounting areas 90A to 90C. The CSW substrate 70 and the SSW substrate 80 are mounted to the mounting area 90A. The CHA substrate 30 is mounted to the mounting area 90B and the DKA substrate 40 is mounted to the mounting area 90C. Incidentally, the CM substrate 50 and the SM substrate 60 are mounted to the mounting area 90A. The substrates of the same kind have compatibility of the mounting position. In the mounting area 90C, for example, each DKA substrate 40 may be fitted to any of the connectors 91.

Figure 5:
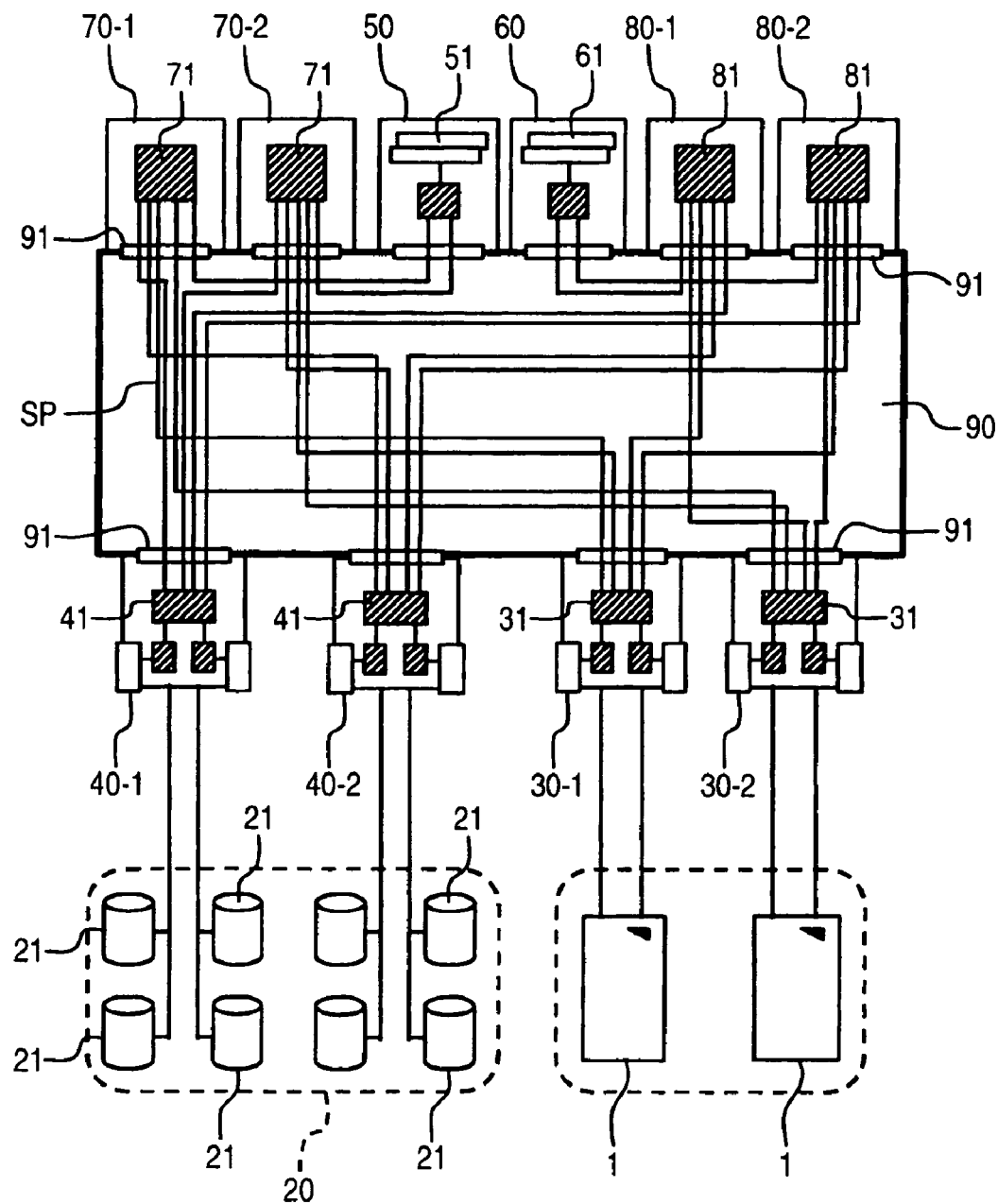
FIG. 5 is an explanatory view showing logical connection of various substrates fitted to a back plane.

FIG. 5 is a logical connection diagram of data paths in the back plane 90. Each substrate 30 to 80 is mounted to the predetermined mounting area 90A to 90C through a predetermined connector 91 and is electrically connected through a wiring pattern group SP so formed as to extend through each layer of the back plane 90. FIG. 5 shows two each of the CHA substrates 30, the DKA substrates 40, the CSW substrates 70 and the SSW substrates 80 and these substrates are distinguished by suffixes "–1" and "–2", respectively. Though the number of each of the various kinds of substrates is 2 in this case for the sake of explanation, 4, 8 or more substrates are mounted in practice to the back plane 90. Reference numerals 31, 41, 71 and 81 denote LSI that executes a main signal processing in each of the substrates. Reference numerals 51 and 61 denote memory modules. As described above, wiring must be made to connect a large number of substrates 30 to 80 in the back plane 90.

Each CHA substrate 30 is connected to each CSW substrate 70 and to each SSW substrate 80. Each DKA substrate 40 is connected to each CSW substrate 70 and to each SSW substrate 80, too. Each CSW substrate 70 is connected to each CHA substrate 30, to each DKA substrate 40 and to each CM substrate 50. Each SSW substrate 80 is connected to each CHA substrate 30, to each DKA substrate 40, too, and to each SM substrate 60.

Figure 6:
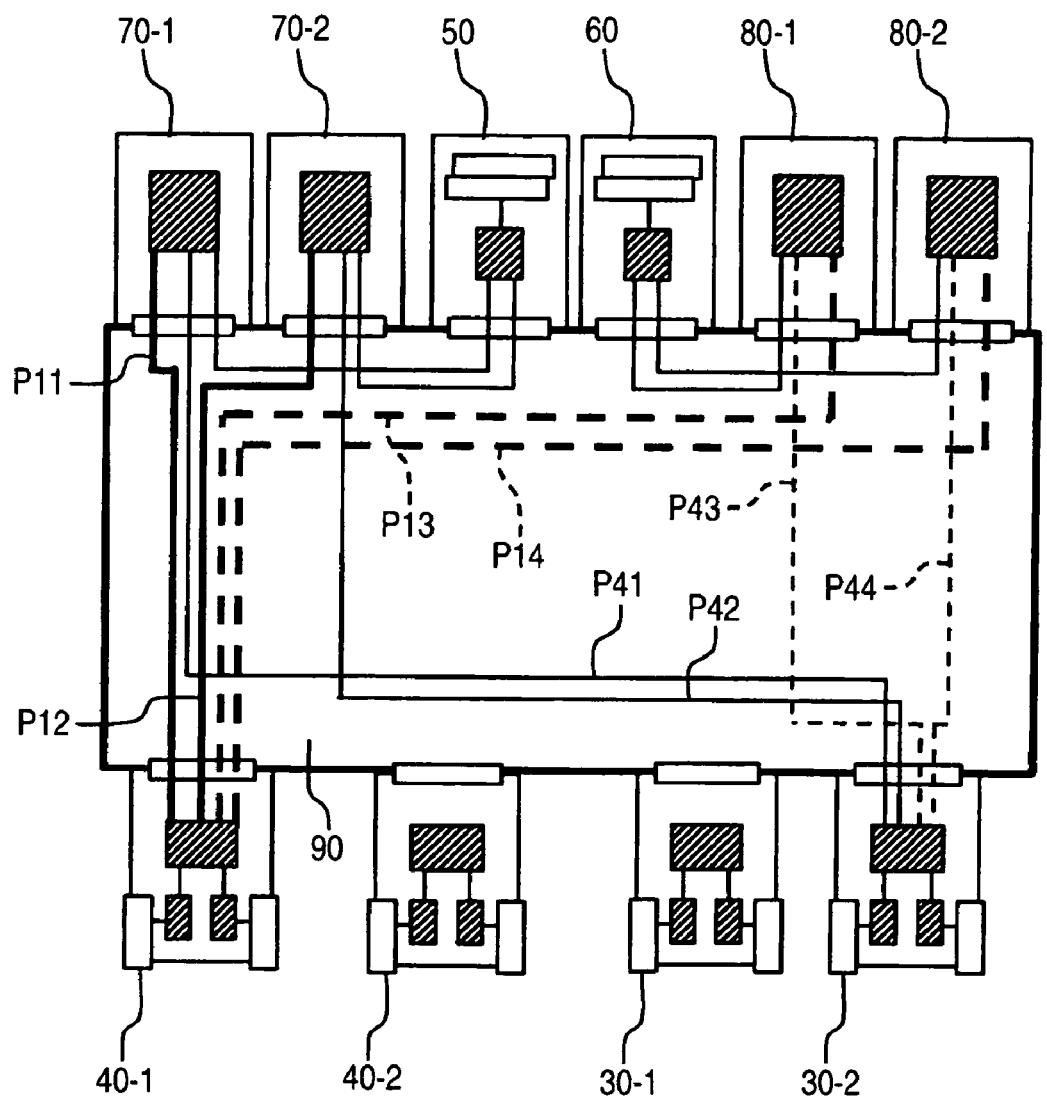
FIG. 6 is an explanatory view showing in extraction a part of a wiring pattern shown in FIG. 5.

FIG. 6 shows a part of the wiring in extraction in FIG. 5. The DKA substrate 40-1 on the left side in the drawing is connected to one of the SCW substrates 70-1 through a wiring pattern P11 and to the other CSW substrate 70-2 through a wiring pattern P12. The DKA substrate 40-1 is connected to one of the SSW substrates 80-1 through a wiring pattern P13 and to the other SSW substrate 80-2 through a wiring pattern P14. The CHA substrate 30-1 on the right side in the drawing is connected to one of the SWC substrates 70-1 through a wiring pattern P41 and to the other CSW substrate 70-2 through a wiring pattern P42. The CHA substrate 30-1 is connected to one of the SSW substrates 80-1 through a wiring pattern P43 and to the other SSW substrate 80-2 through a wiring pattern P44. Incidentally, the wiring patterns P11, P12, P41 and P42 to the CSW substrate 70 will be referred to as "C path" and the wiring patterns P13, P14, P43 and P44 to the SSW substrate 81, as "S path".

Figure 7:
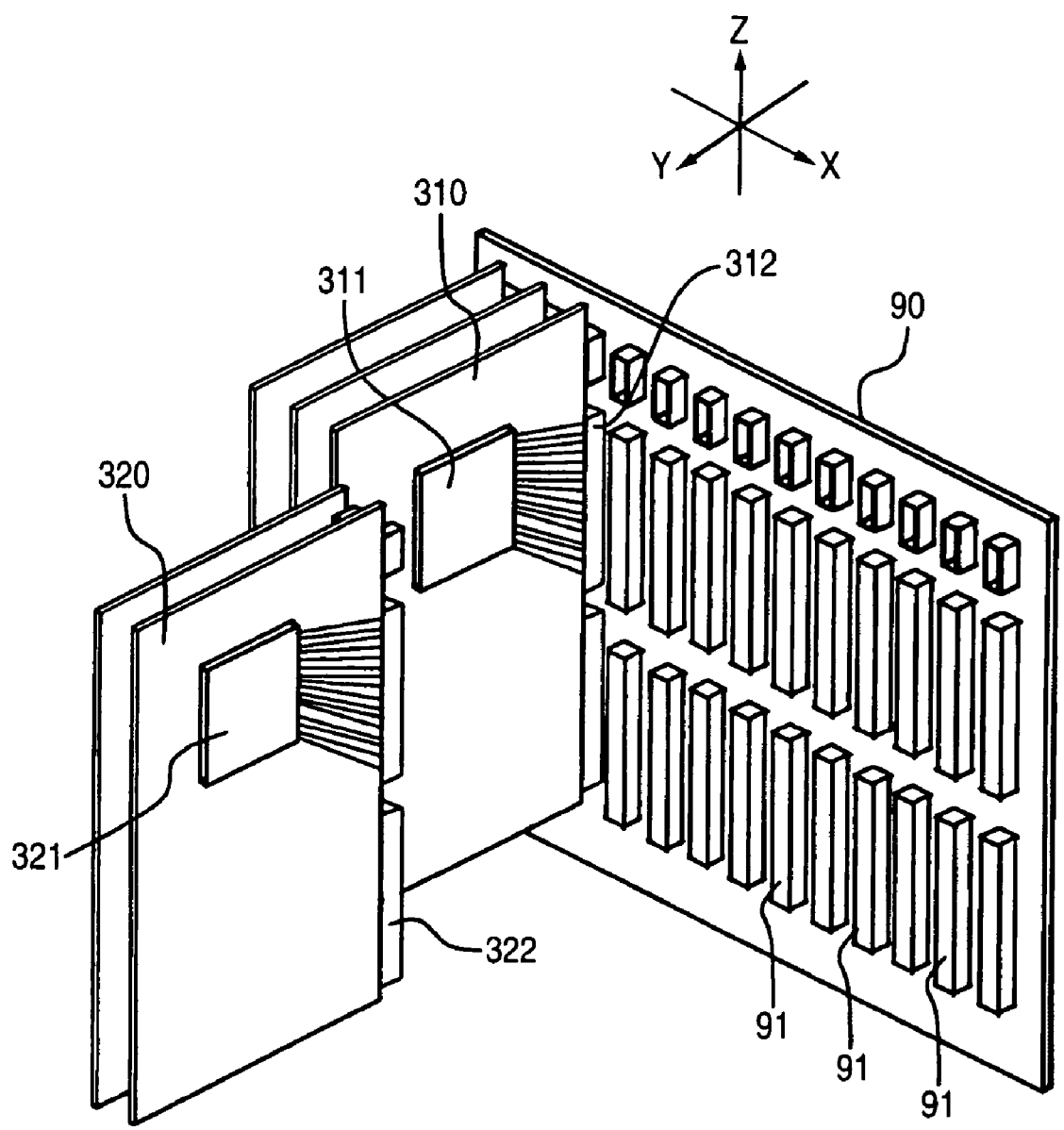
FIG. 7 is a perspective view showing a relation among an adaptor substrate, a bus switch substrate and a connector fitted to the back plane.

FIG. 7 shows a mode of mounting an adaptor substrate 310 and a bus switch substrate 320 to the back plane 90. The term "adaptor substrate" 310 is a generic term of the CHA substrate 30 and the DKA substrate 40 and the term "bus switch substrate" 320 is a generic term of the CSW substrate 70 and the SSW substrate 80. Each adaptor substrate 310 includes a signal processing LSI 311 and a connector 312. Similarly, each bus switch substrate 320 includes a signal processing LSI 321 and a connector 322. A plurality of wiring patterns extended from the LSI 311 and 321 is connected to each of the connectors 312 and 322. Each of the connectors 312 and 322 fits to a predetermined connector 91 disposed on the back plane 90. In consequence, each of the substrates 310 and 320 is electrically connected to the wiring pattern of the back plane 90. In this embodiment, each data path group of the same substrate is arranged in parallel in an X direction as an arranging direction of each substrate and corresponding formation positions of signal pins of the adaptor substrate and the bus switch substrates are aligned in a Z direction as an arranging direction of the signal pins as will be described later.

Figure 8:
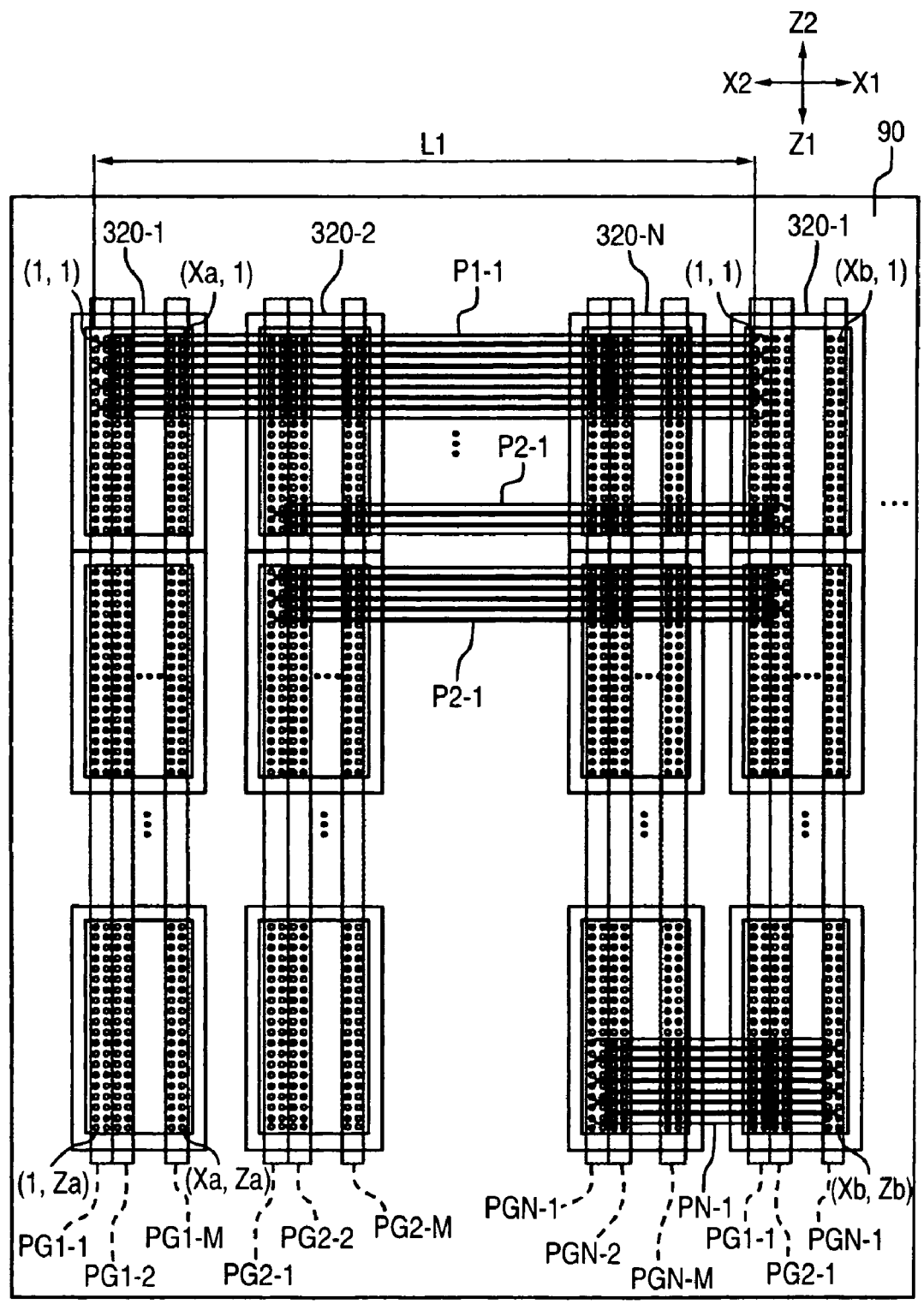
FIG. 8 is a schematic plan view showing a relation between a signal pin group and a wiring pattern group of the each connector fitted to the back plane.

FIG. 8 shows in magnification a part of the back plane 90. FIG. 8 shows the arrangement of the signal pins of each connector 91 mounted to the back plane 90 and the wiring patterns connecting the signal pins. To have the invention easily understood, the reference numerals of the substrates 310 and 320 fitted to each connector 91 are used in place of the reference numeral of the connector 91. Furthermore, the explanation will be given on the case where N adaptor substrates 310 and M bus switch substrates 320 are mounted to the back plane 90 by way of example. For the sake of explanation, only the first substrate 320-1 of the bus switch substrates 320 is shown in the drawing with the rest of the bus switch substrates 320 being omitted.

Xa signal pins of the connector for the adaptor substrates exist in the X direction and Za pins, in the Z direction, and the total number of pins is (Xa×Za). Similarly, Xb signal pins of the connector for the bus switch substrates exist in the X direction and Zb pins, in the Z direction, and the total number of pins is (Xb×Zb). To efficiently execute the printing wiring system according to the invention, the number of pins Za of the connector for the adaptor substrate in the Z direction and the number of pins of the connector for the bus switch substrate in the Z direction preferably satisfy the relation Zb≧Za.

M bus switch substrates 320 are connected to all of N adaptor substrates 310, respectively. In other words, N adaptor substrates 310 are connected to M bus switch substrates 320. Therefore, each connector for the bus switch substrates has a number of signal pins necessary for receiving the signals from all the adaptor substrates 310. The signal pins of the connector for each adaptor substrate are divided into M data path groups and the signal pins of the connector for each bus switch substrate are divided into N data path groups.

Let's consider the connector for one adaptor substrate 310-1 shown on the left side of the drawing. The signal pin group of this connector is grouped into M data path groups of from PG1-1 to PG-LM. Each data path group PG1-1 to PG1-M is so formed as to extend in the Z direction and is adjacent to the X direction. The connector for the adaptor substrate 310-1 is connected to the M bus switch substrates 320 through each data path group PG1-1 to PG1-M. In other words, the first data path group PG1-1 is connected to the first bus switch substrate 310-1 and the second data path group PG1-2 is connected to the second bus switch substrate (not shown in the drawing, reference numeral 320-2 when denoted). The Mth data path group PG1-M is connected to the Mth bus switch substrate (not shown in the drawing, reference numeral 320-M when denoted).

The construction described above also holds true of the connectors for the other adaptor substrates 320-2 to 320-N. For example, the signal pin group of the connector for the second adaptor substrate 320-2 is grouped into M data path groups PG2-1 to PG2-M and is connected to the M bus switch substrates 320 through each data path group PG2-1 to PG2-M. Similarly, the signal pin group of the connector 310-N for the Nth adaptor substrate is grouped into M data path groups PGN-1 to PGN-M and is connected to the each bus switch substrates 320 through each data path group PGN-1 to PGN-M.

Therefore, the signal pin group of the connector for the first bus switch substrate 320-1 shown on the right side in the drawing is grouped into first data path groups PG1-1 to PGN-1 corresponding respectively to the connectors for the adaptor substrates 310-1 to 310-N. Similarly, the signal pin group of the connector for the second bus switch substrate is grouped into second data path groups PG1-2 to PGN-2 corresponding respectively to the connectors for the adaptor substrates 310-1 to 310-N. The similar relation is also applied up to the connectors for the Mth bus switch substrates.

The data path group of the connector for each of the adaptor substrates 310-1 to 310-N and the corresponding data path group of the connector for each of the bus switch substrate 320 are respectively connected through the wiring pattern group. When the connector for the first bus switch substrate 320-1 is taken into consideration, the first data path group PG1-1 is connected through the wiring pattern group P1-1. The second data path group PG2-1 is connected through the wiring pattern group P2-1. Similarly, the Nth data path group PGN-1 is connected through the wiring pattern group PN1-1.

It is hereby noteworthy that each of the wiring pattern groups P1-1 to PN-1 is formed substantially linearly and position adjustment in the Z direction hardly exists. More concretely, each wiring pattern group P1-1 to PN-1 is bent to 45° in a predetermined direction near at both of its end for the connection with the signal pin. In the strict sense, therefore, each wiring pattern is not linear. However, the each wiring pattern group is formed linearly at the major portions other than near both ends. In this embodiment, therefore, the wiring length of the wiring pattern connecting the corresponding signal pins to one another is substantially equal to the distance L between the corresponding signal pins or falls within a predetermined range. In the case of the connector for the first adaptor substrate 310-1 and the connector for the first bus switch substrate 320-1, for example, the wiring length LP1-1 of the wiring pattern group P1-1 for connecting the first data path group PG1-1 is not greater than 1.2 times the distance L1 between the corresponding signal pins (L1≦LP1-1≦1.2×L1).

Next, the wiring method will be described. First of all, the first data path group PG1-1 of the connector for the first adaptor substrate 310-1 is connected by the wiring pattern group P1-1 formed inside the back plane 90. Connection is started from the signal pins of the row of the X coordinates=1. Because each of the connectors 310-1 to 310-N is mounted to the surface of the back plane 90, that is, the connector mounting surface layer, the wiring pattern is not formed. Therefore, in the next layer capable of wiring, the signal pin (1, 1) of the connector for the adaptor substrate 310-1 and the signal pin (1, 1) of the connector for the bus switch substrate 320-1 are connected through print wiring. Here, the wires are taken out obliquely at 45° in the X1-Z1 direction from the signal pin (1, 1) of the connector for the adaptor substrate 310-1 and is extended in the X1 direction in such a manner as not to come into contact with a through-hole clearance of the signal pin. The wires are then inclined at 45° in the X1-Z2 direction in the proximity of the signal pin (1, 1) of the connector for the bus switch substrate 320-1 and are connected to the signal pin (1, 1) on the side of the bus switch.

Similarly, the signal pin (1, 2) of the connector for the adaptor substrate 310-1 and the signal pin (1, 2) of the corresponding connector for the bus switch substrate 320-1 are connected by forming them obliquely at an angle of 45° in the proximity of both ends of the wires and linearly in the X direction at other portions. However, the extending direction at the angle of 45° becomes opposite. In other words, the wires are inclined at 45° in the X1-Z2 direction on the side of the connector for the adaptor substrate 310-1 and at 45° in the X1-Z1 direction on the side of the connector for the bus switch substrate 320-1. Incidentally, up to two wiring patterns can be formed between the through-hole clearances of the signal pins. In this way, the signal pins of the row of the X coordinates=1 are respectively wired from the Z coordinates=1 to the Z coordinates=Za.

Next, the operation shifts to the row of the X coordinates=2. In this case, too, the wires are formed obliquely at 45° in a predetermined direction in the proximity of both ends and the rest of portions are linearly formed in the X direction.

Wiring of the row of the X coordinates=3 is accomplished by other wiring layer different from the wiring layer used for the signal pin columns of the X coordinates=1 and the X coordinates=2. For, maximum two print wirings are allowed to pass through the through-hole clearance in this embodiment. Wiring of the columns of the X coordinates=3 and the X coordinates=4 is conducted in the same way as in the X coordinates=1 and the X coordinates=2. Whenever the X coordinates thereafter assume an odd number, the wiring layer of the back plane 90 is changed. In this way, the signal pin group of all the connectors for the adaptor substrate 310-1 and the corresponding signal pin group of the connectors for the bus switch substrate are connected respectively by using a plurality of wiring layers.

In this embodiment, the signal pins of each data path group are constituted by two rows adjacent to each other in the X direction. Therefore, wiring is made by using different wiring layers for each data path group. Speaking reversely, only the wiring pattern group belonging to the same data path group can be formed in each wiring layer of the back plane 90.

As described above in detail, the formation positions of the corresponding signal pins are aligned at the same positions in the Z direction in this embodiment. In other words, since the corresponding signal pins are so arranged as to be horizontal on the same plane, the adjustment amount of the wiring pattern for connecting mutually the corresponding signal pins in the Z direction can be decreased much more than in the prior art and the wiring pattern groups can be linearly formed with the exception of the portions near both of their ends. Consequently, the wiring pattern need not be bent at portions other than near both end portions and the occurrence of the curve points can be suppressed. Reflection of the signals due to the impedance change at the curve points and the occurrence of the radiation noise from the curve points can thus be reduced. Furthermore, because the wiring pattern groups can be formed substantially linearly, the wiring length can be limited within 1.2 times the spacing between the corresponding signal pins. Prevention of the occurrence of the curve points and reduction of the wiring length can reduce the transfer loss and can accomplish high quality signal transfer. Because the adjustment range in the Z direction is not necessary, a greater number of substrates can be mounted without increasing the area of the back plane 90.

Figure 9A:
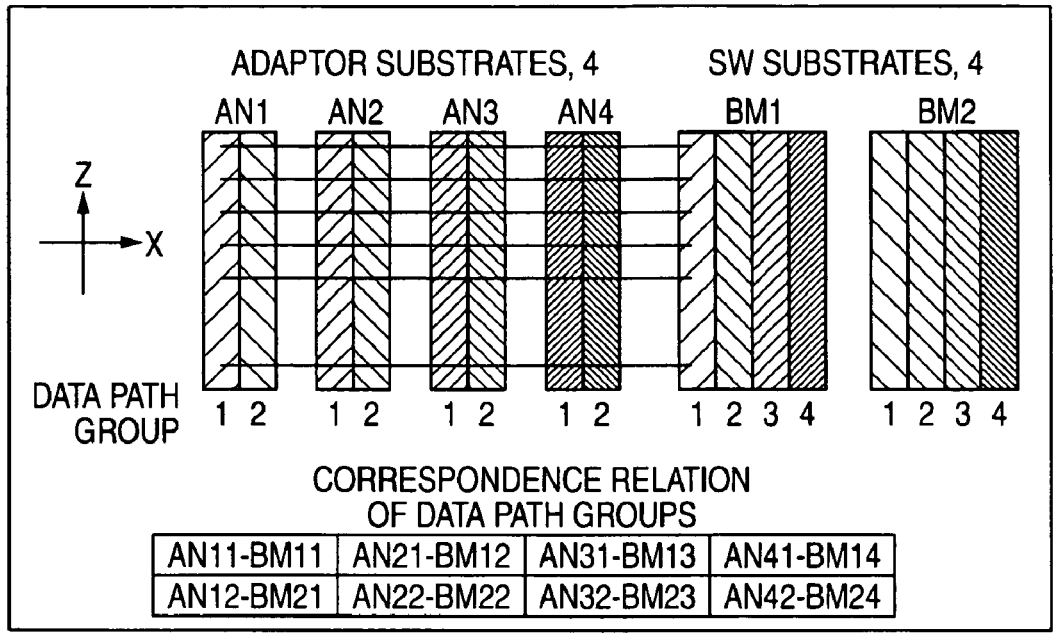
FIG. 9 is a schematic view showing a printed wiring structure according to an embodiment in comparison with a printed wiring structure according to other method.
Figure 9B:
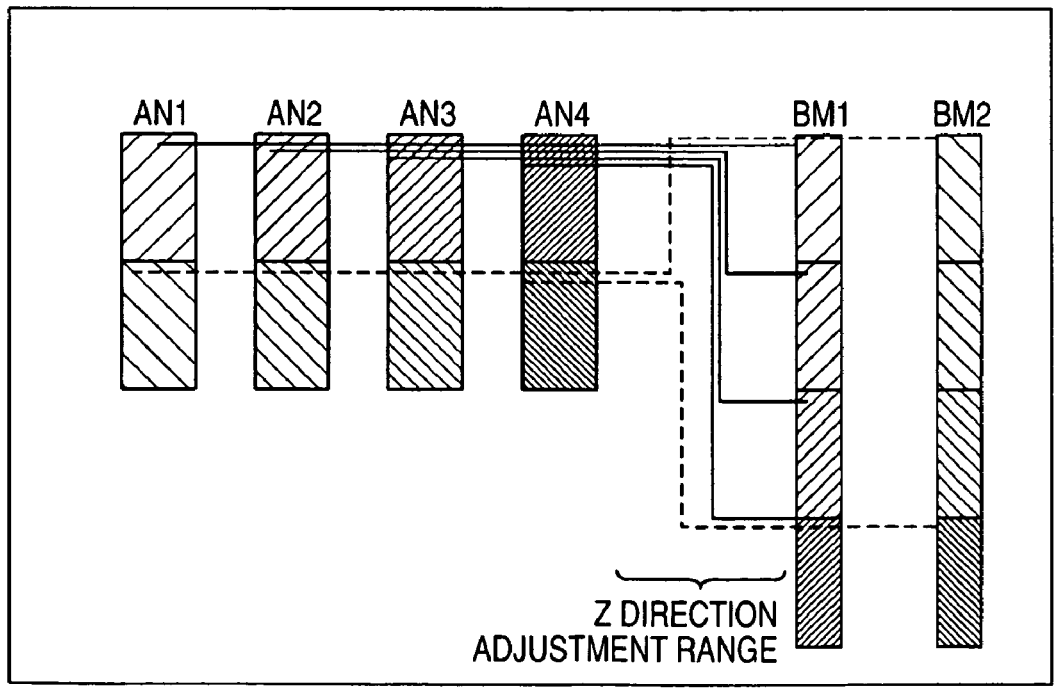
Figure 10:
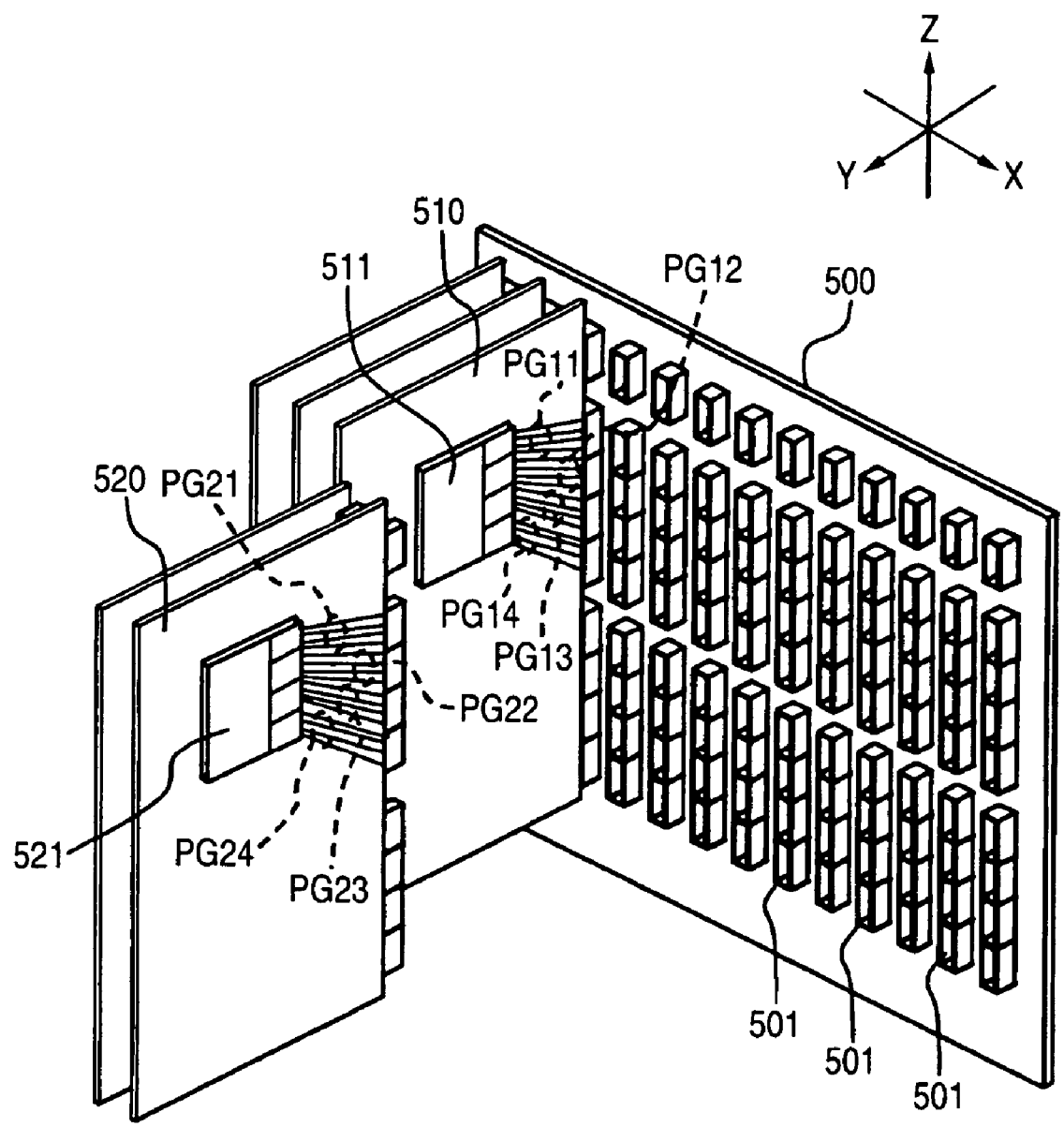
FIG. 10 is a perspective view showing an example where the signal pin group is divided in a Z direction and various substrates are fitted to the back plane.
Figure 11:
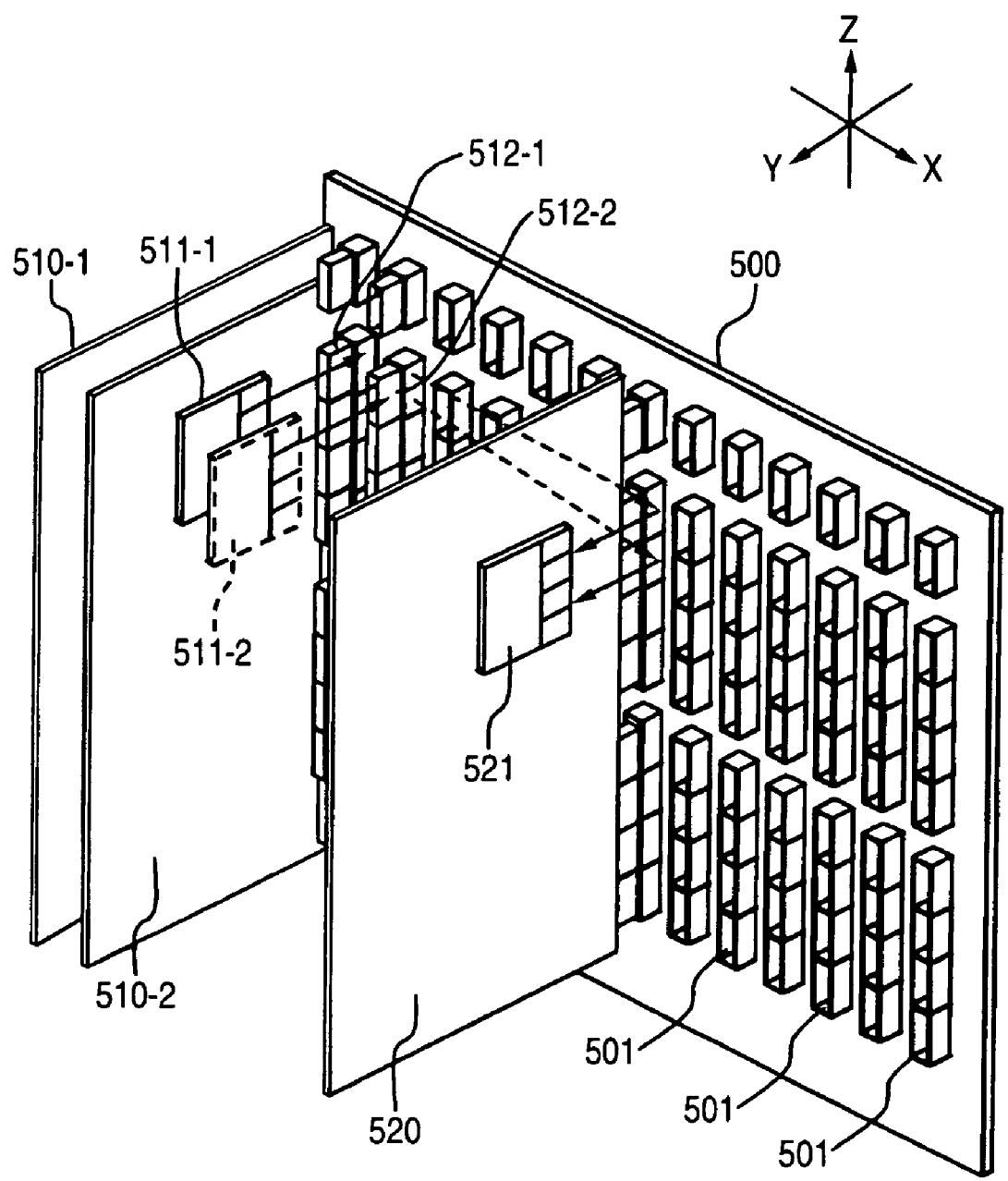
FIG. 11 is a perspective view showing necessity for position adjustment of the wiring pattern in the Z direction.
Figure 12:
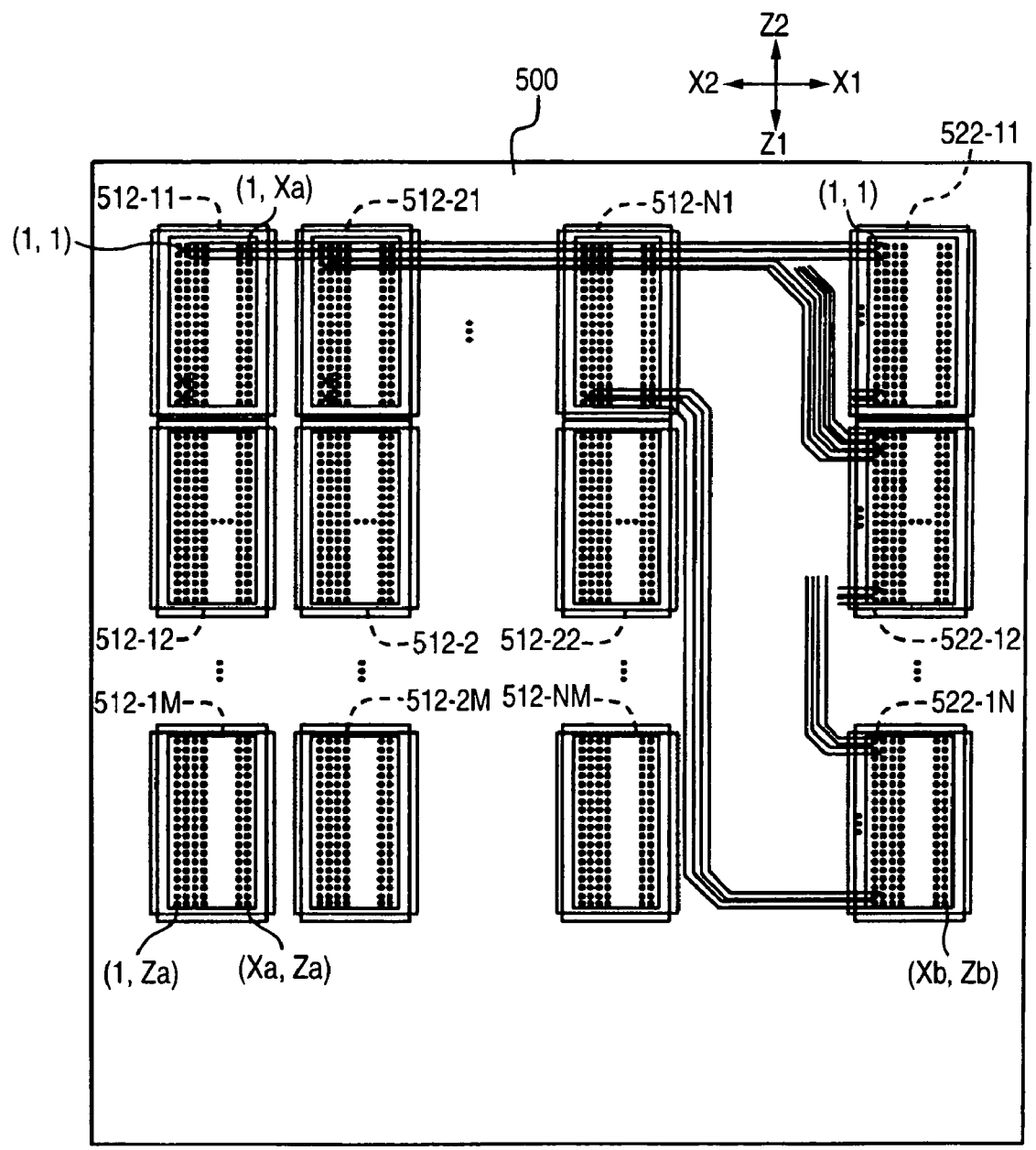
FIG. 12 is a schematic plan view showing a relation between each signal pin group and each wiring pattern group fitted to the back plane.
Figure 13:
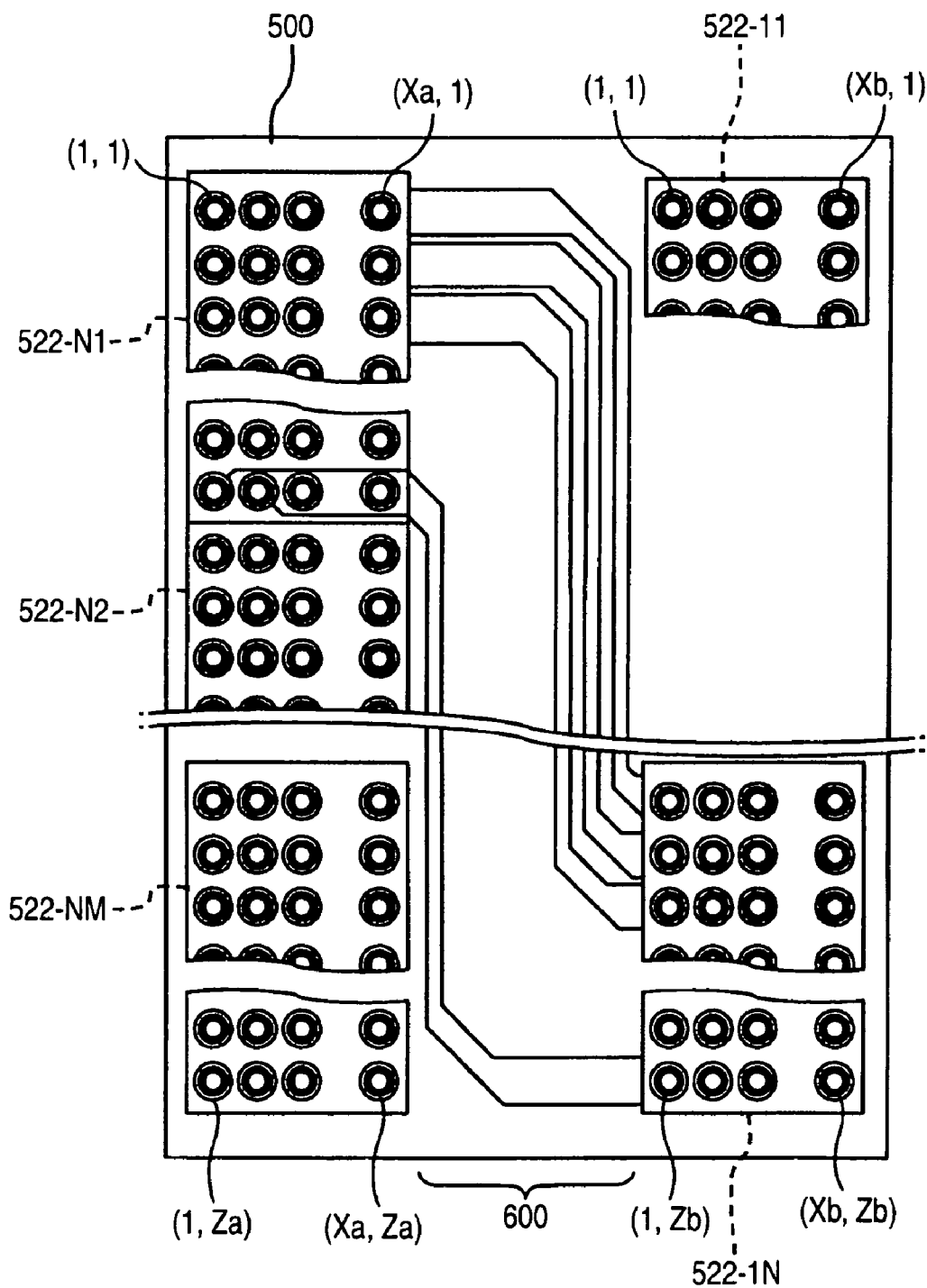
FIG. 13 is a plan view showing in enlargement a part of FIG. 12.

This point will be explained with reference to the schematic view of FIG. 9. According to the embodiment, as shown in FIG. 9A, the signal pins constituting each data path group of each of the adaptor substrates AN1 to AN4 and the signal pins of the corresponding bus switch substrates BM1 and BM2 are arranged horizontally. Therefore, the wiring patterns can be formed substantially linearly. In contrast, when the positions of the corresponding signal pins are not aligned horizontally as shown in FIG. 9B, the position adjustment in the Z direction must be made at an intermediate part of each wiring pattern and the wiring length becomes greater than the spacing between the signal pins (wiring length>1.2×spacing between signal pins). In addition, a large number of curve points occur. In the case of FIG. 9B, therefore, high quality signal transfer become difficult and the width of the back plane (length in the X direction) becomes longer to the extent corresponding to the extension of the wiring pattern groups in the Z direction. Consequently, it is difficult to mount the substrates in a high density.

The invention is not particularly limited to the embodiment described above but can be changed or modified in various ways by those skilled in the art without departing from the scope thereof. For example, though the signal pins constituting each data path group is aligned in the Z direction in the embodiment, the signal pins adjacent to one another in the X direction may be arranged while being deviated by a predetermined distance from one another in the Z direction such as a zigzag arrangement. The invention is suitable for a back plane of a disk array control portion that uses a plurality of substrates and moreover a plurality of various kinds of substrates for accomplishing a redundant structure but can also be applied to back planes of other electronic appliances having such a feature.

What is claimed is:

1. The fitting substrate for connection to which first and second kinds of signal processing substrates mutually transmitting and receiving signals are fitted, comprising:

a substrate main body;

first signal connection point groups formed on said substrate main body and connected to said first kind of signal processing substrate;

second signal connection point groups formed on said substrate main body and connected to said second kind of signal processing substrate; and wiring pattern groups for electrically connecting mutually corresponding signal connection points of said first and second signal connection point groups to one another, wherein said first and second signal connection point groups are respectively formed so that mutually corresponding signal connection points can be arranged substantially horizontally on the same plane, and said wiring pattern group is formed substantially linearly to match with the arrangement of each of said signal connection points, wherein said first and second signal connection point groups are so formed on the same plane so as to extend in a first direction and said wiring pattern groups are formed as to extend in a second direction intersecting orthogonally said first direction, wherein N1 of said first kind of signal processing substrate and N2 of said second kind of signal processing substrate are fitted to said substrate main body, wherein said first signal connection point groups are constituted by N2 of signal path groups adjacent to one another in said second direction and said second signal connection point groups are constituted by N1 of signal path groups adjacent to one another in said second direction, wherein said substrate main body is formed into multiple layers and said wiring pattern groups are constituted by a plurality of wiring layers that form said substrate main body, and wherein said first signal connection point groups are constituted by a plurality of first signal connection rows adjacent to one another in said second direction, said second signal connection point groups are constituted by a plurality of second signal connection rows adjacent to one another in said second direction, and each of said connection groups constituted by at least one of said first signal connection rows and at least one of said second signal connection rows is connected by said wiring pattern groups by using different ones of said wiring layers.

2. A fitting substrate for connection to which first and second kinds of signal processing substrates mutually transmitting and receiving signals are fitted, comprising:

a substrate main body;

first signal connection point groups formed on said substrate main body and connected to said first kind of signal processing substrate;

second signal connection point groups formed on said substrate main body and connected to said second kind of signal processing substrate; and wherein pattern groups for electrically connecting mutually corresponding signal connection points of said first and second signal connection point groups to one another, wherein said first and second signal connection point groups are respectively formed so that mutually corresponding signal connection points can be arranged substantially horizontally on the same plane, and said wiring pattern group is formed substantially linearly to match with the arrangement of each of said signal connection points, wherein said first and second signal connection point groups are so formed on the same plane so as to extend in a first direction and said wiring pattern groups are formed as to extend in a second direction intersecting orthogonally said first direction, wherein N1 of said first kind of signal processing substrate and N2 of said second kind of signal processing substrate are fitted to said substrate main body, wherein said first signal connection point groups are constituted by N2 of signal path groups adjacent to one another in said second direction and said second signal connection point groups are constituted by N1 of signal path groups adjacent to one another in said second direction, wherein said substrate main body is formed into multiple layers and said wiring pattern groups are constituted by a plurality of wiring layers that form said substrate main body, and wherein said N2 of signal path groups of each of said signal processing substrates is connected by said wiring pattern groups by using different ones of said wiring layers.

* * * * *